US011999477B2

(12) United States Patent
Shin

(10) Patent No.: US 11,999,477 B2
(45) Date of Patent: Jun. 4, 2024

(54) DRONE STATION

(71) Applicant: AMOSENSE CO., LTD, Cheonan-si (KR)

(72) Inventor: Gyu Weon Shin, Daejeon (KR)

(73) Assignee: AMOSENSE CO., LTD, Cheonan-si (KR)

( * ) Notice: Subject to any disclaimer, the term of this patent is extended or adjusted under 35 U.S.C. 154(b) by 776 days.

(21) Appl. No.: 17/261,452

(22) PCT Filed: Jul. 19, 2019

(86) PCT No.: PCT/KR2019/008992
§ 371 (c)(1),
(2) Date: Jan. 19, 2021

(87) PCT Pub. No.: WO2020/017938
PCT Pub. Date: Jan. 23, 2020

(65) Prior Publication Data
US 2021/0163135 A1    Jun. 3, 2021

(30) Foreign Application Priority Data

Jul. 20, 2018  (KR) .................. 10-2018-0084810
Dec. 11, 2018  (KR) .................. 10-2018-0158876

(51) Int. Cl.
| | | |
|---|---|---|
| H02J 50/10 | (2016.01) | |
| B64C 39/02 | (2023.01) | |
| B64F 1/00 | (2006.01) | |
| B64U 70/90 | (2023.01) | |
| B64U 70/97 | (2023.01) | |
| H01F 27/36 | (2006.01) | |

(Continued)

(52) U.S. Cl.
CPC ............ B64C 39/024 (2013.01); B64F 1/005 (2013.01); H01F 27/366 (2020.08); H02J 50/10 (2016.02);
(Continued)

(58) Field of Classification Search
CPC ...... B64U 50/38; B64U 70/90; B64U 70/097; B64U 5/37; B64F 1/007
See application file for complete search history.

(56) References Cited

U.S. PATENT DOCUMENTS 11,148,805 B2 * 10/2021 Cooper .................. B64F 1/222
2011/0174925 A1 * 7/2011 Ying ...................... B64F 1/005
701/16

(Continued)

FOREIGN PATENT DOCUMENTS

JP      2017-124758 A    7/2017
KR     10-1700396 B1    1/2017

(Continued)

OTHER PUBLICATIONS

IN Office Action in Application No. 202117002364 dated Sep. 10, 2021.

(Continued)

Primary Examiner — Timothy D Collins
Assistant Examiner — Terri L Filosi
(74) Attorney, Agent, or Firm — Maschoff Brennan

(57) ABSTRACT

Disclosed is a drone station which allows the center of resonance of a drone to be always accurately aligned regardless of the initial landing position of the drone. The disclosed drone station includes a landing guidance instrument and a wireless charging instrument which is formed on the landing guidance instrument and wirelessly transmits the power to a drone positioned thereon, the landing guidance instrument having an inclined surface which moves the landed drone onto the top of the wireless charging instrument.

15 Claims, 13 Drawing Sheets

(51) Int. Cl.
    *B60L 53/126*     (2019.01)
    *B64U 50/34*     (2023.01)
    *B64U 70/60*     (2023.01)
    *H01F 38/14*     (2006.01)
    *H02J 50/90*     (2016.01)

(52) U.S. Cl.
    CPC ............. *B60L 53/126* (2019.02); *B64U 50/34* (2023.01); *B64U 70/60* (2023.01); *B64U 70/90* (2023.01); *B64U 70/97* (2023.01); *H01F 38/14* (2013.01); *H02J 50/90* (2016.02)

(56) References Cited

U.S. PATENT DOCUMENTS

| | | |
|---|---|---|
| 2013/0341462 A1 | 12/2013 | Jacobs |
| 2017/0073084 A1 | 3/2017 | Mozer |
| 2018/0056794 A1 | 3/2018 | Kim et al. |
| 2018/0219425 A1* | 8/2018 | Choi ........................ H02J 50/70 |
| 2018/0316085 A1* | 11/2018 | Park ..................... H01Q 1/3291 |

FOREIGN PATENT DOCUMENTS

| | | | |
|---|---|---|---|
| KR | 10-2017-0038749 A | 4/2017 | |
| KR | 10-2017-0040961 A | 4/2017 | |
| KR | 10-2017-0049840 A | 5/2017 | |
| KR | 10-2017-0083856 A | 7/2017 | |
| KR | 10-2017-0132923 A | 12/2017 | |
| KR | 10-2018-0053973 A | 5/2018 | |
| KR | 10-2018-0082164 A | 7/2018 | |
| WO | WO-2018042238 A1 * | 3/2018 | .............. B64F 1/007 |

OTHER PUBLICATIONS

KR Office Action dated Sep. 28, 2020 as received in Application No. 10-2009-0087855.

* cited by examiner

[FIG. 1]
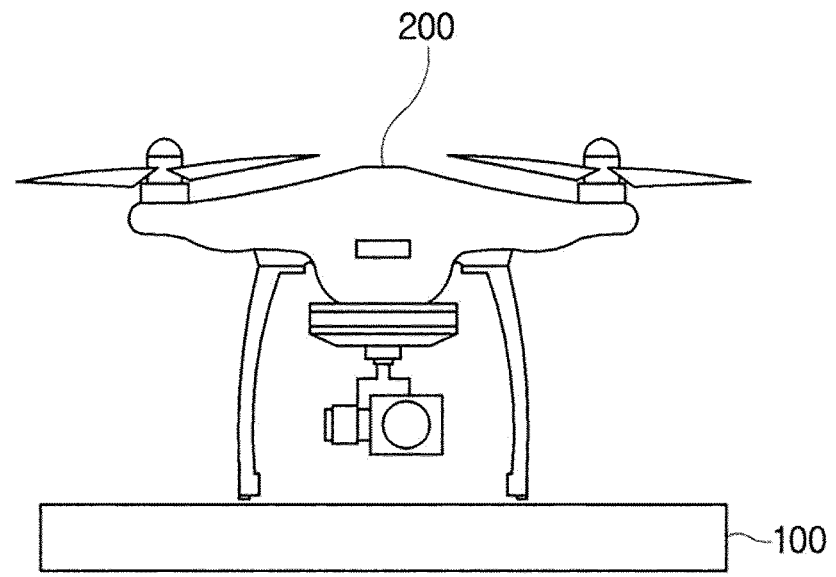
[FIG. 2]
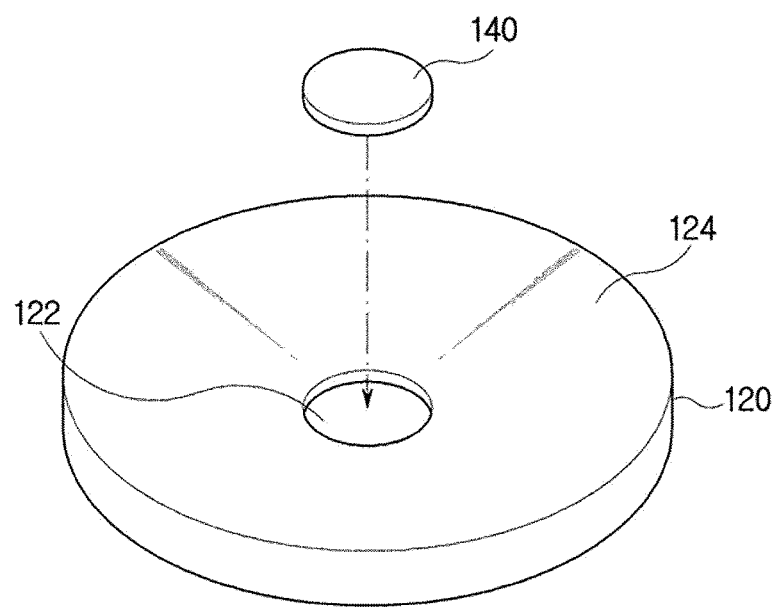

[FIG. 3]
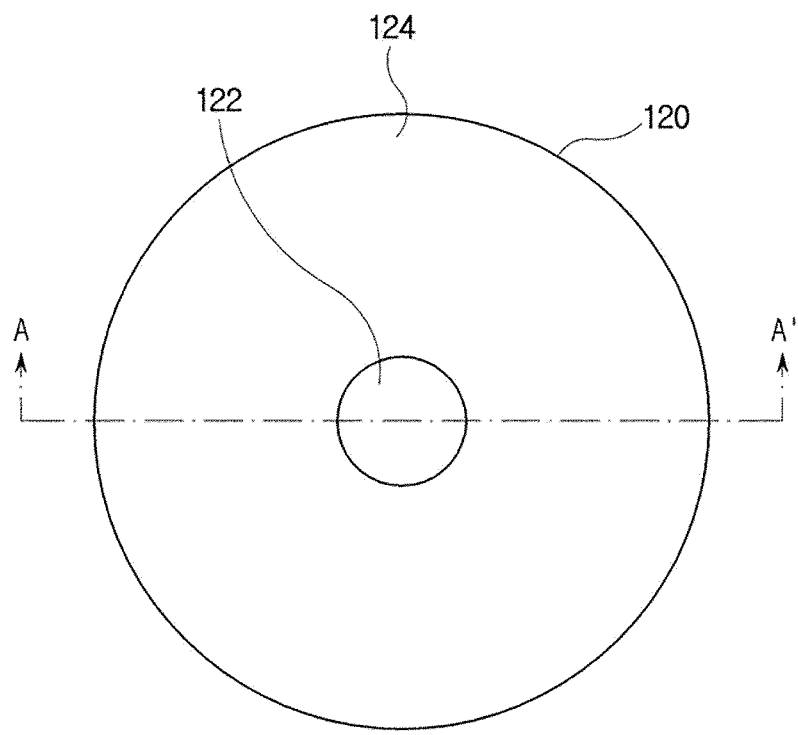
[FIG. 4]
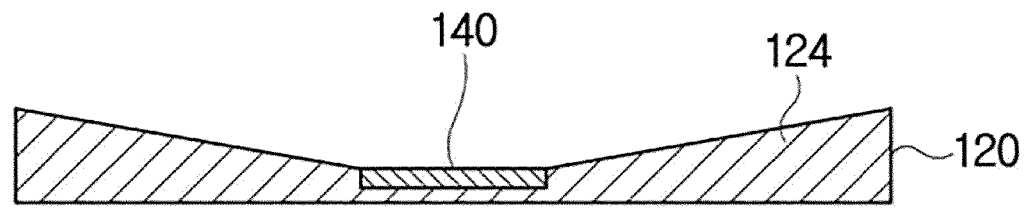

[FIG. 5]
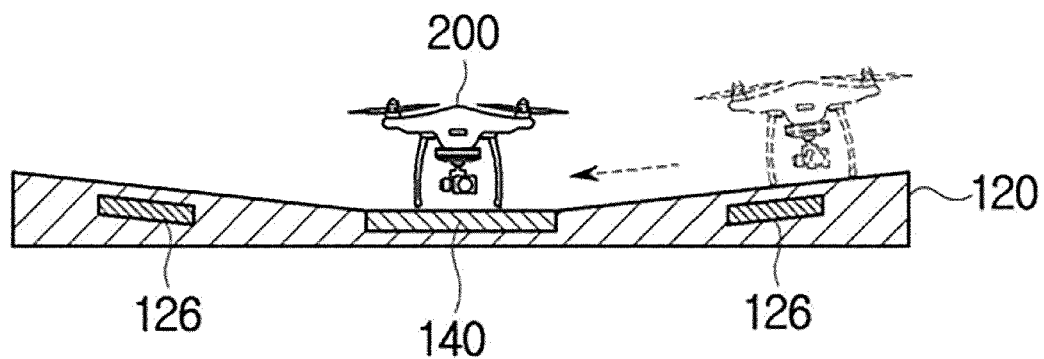
[FIG. 6]
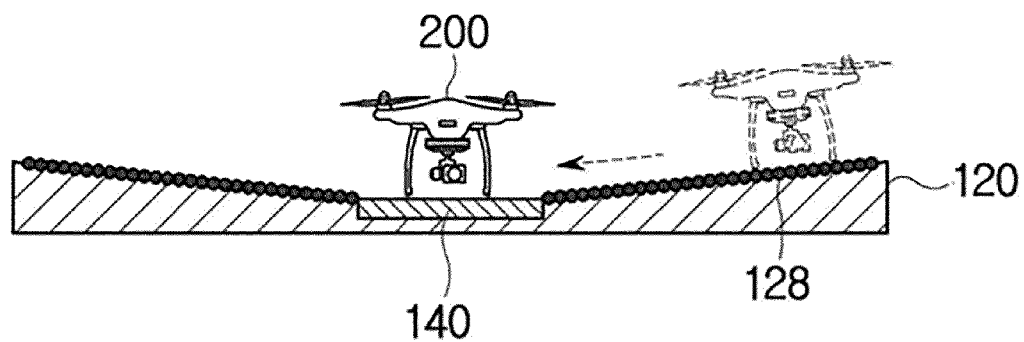

[FIG. 7]
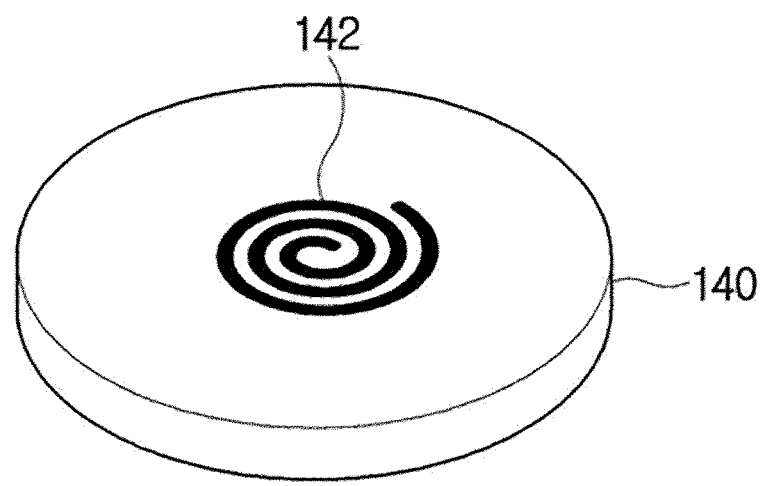
[FIG. 8]
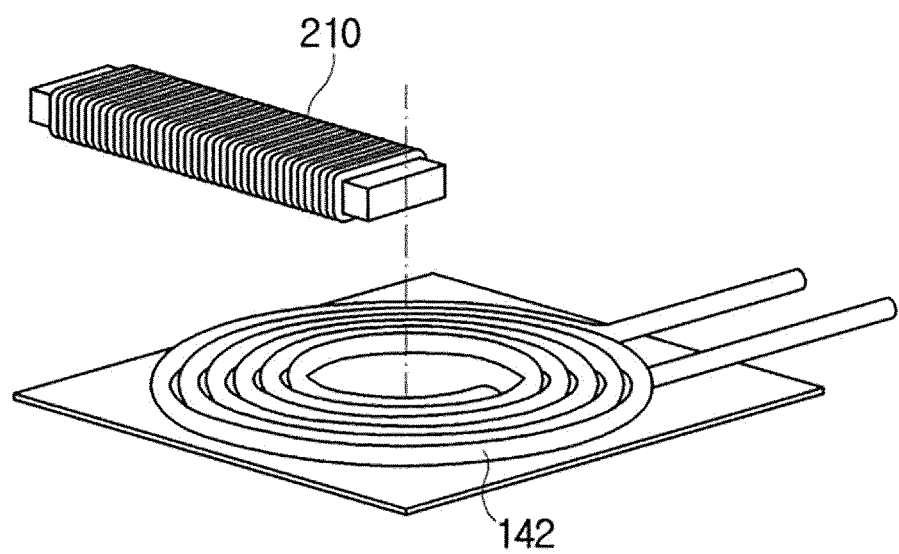

[FIG. 9]

| ECCENTRIC DISTANCE (mm) | INTERNAL COIL CHARGING EFFICIENCY | EXTERNAL COIL CHARGING EFFICIENCY | FINAL OPERATING COIL (CHARGING EFFICIENCY) |
|---|---|---|---|
| 0 | 92 | 73 | INTERNAL COIL (92) |
| 5 | 89 | 72 | INTERNAL COIL (89) |
| 7.5 | 86 | 80 | INTERNAL COIL (86) |
| 10 | 79 | 81 | EXTERNAL COIL (81) |
| 12.5 | 75 | 80 | EXTERNAL COIL (80) |
| 15 | 48 | 80 | EXTERNAL COIL (80) |
| 17.5 | - | 78 | EXTERNAL COIL (78) |
| 20 | - | 73 | EXTERNAL COIL (73) |

[FIG. 10]
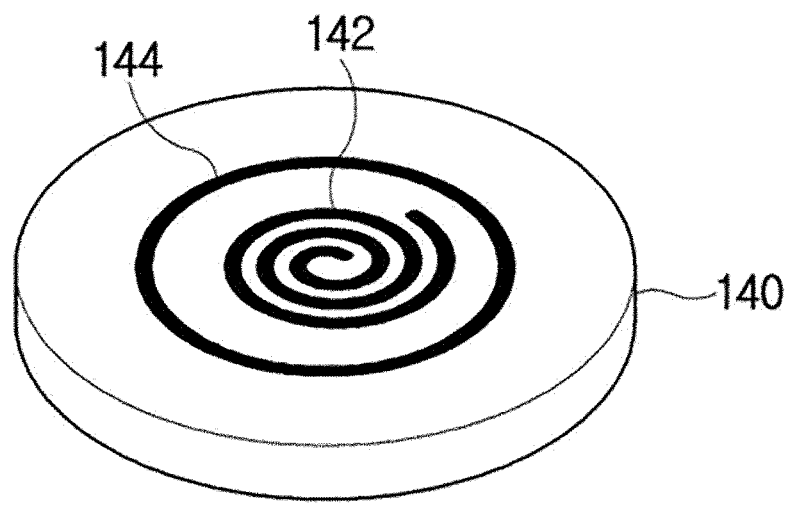
[FIG. 11]
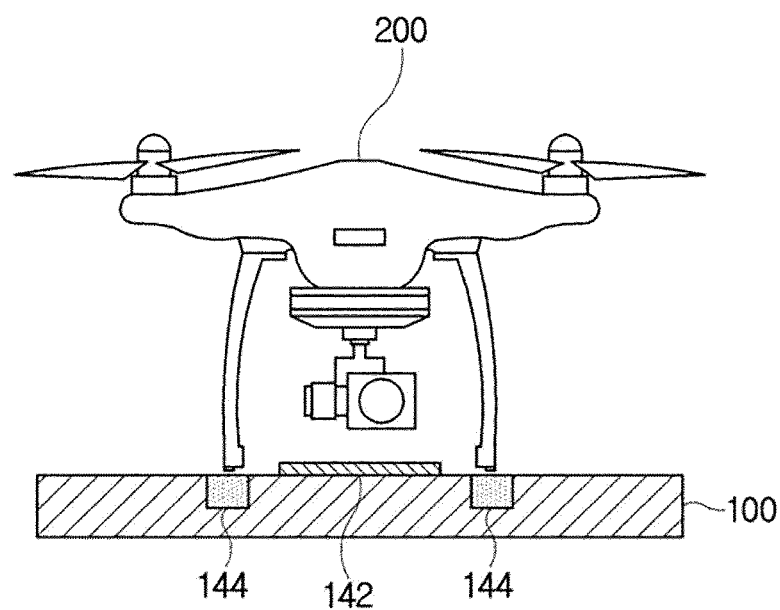

[FIG. 12]
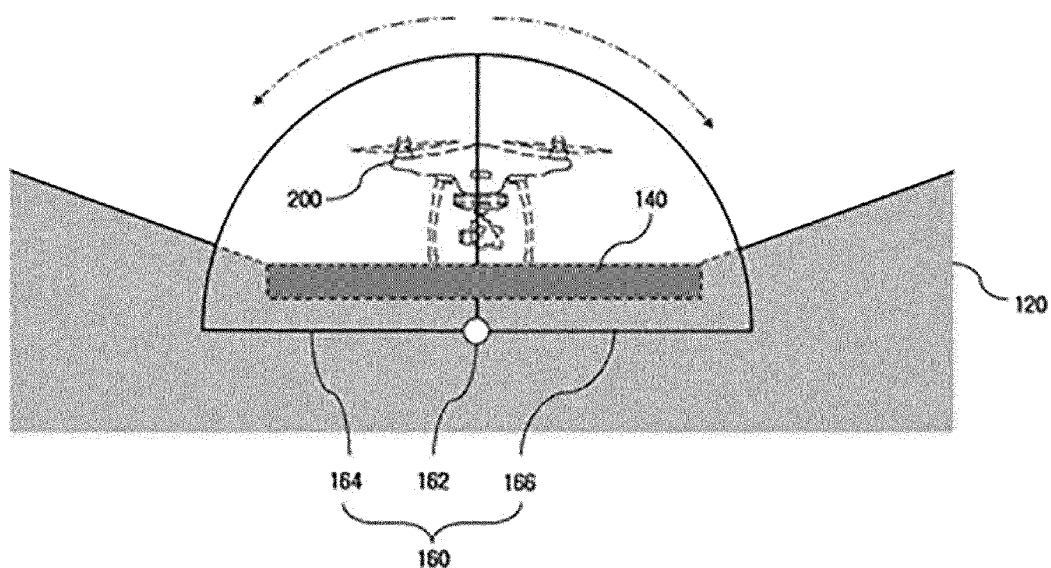
[FIG. 13]
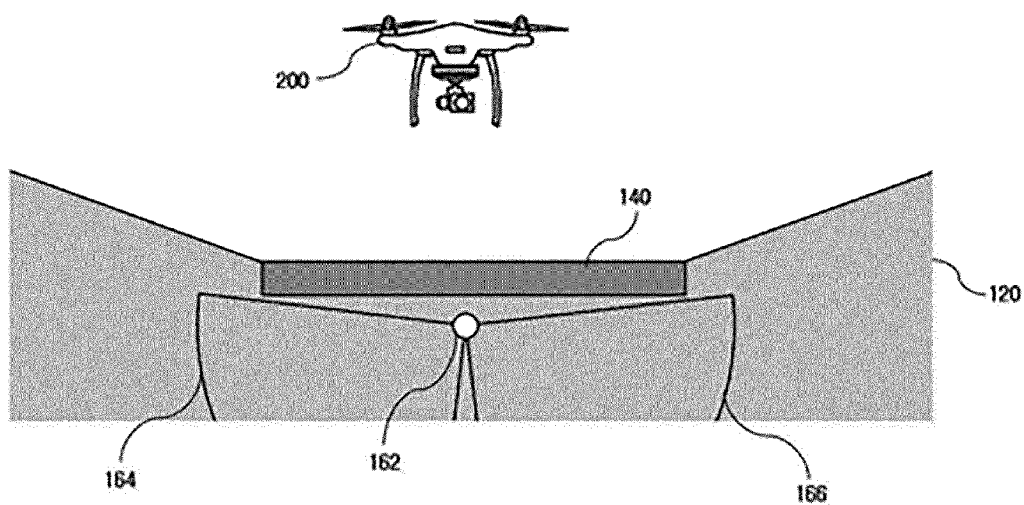

[FIG. 14]
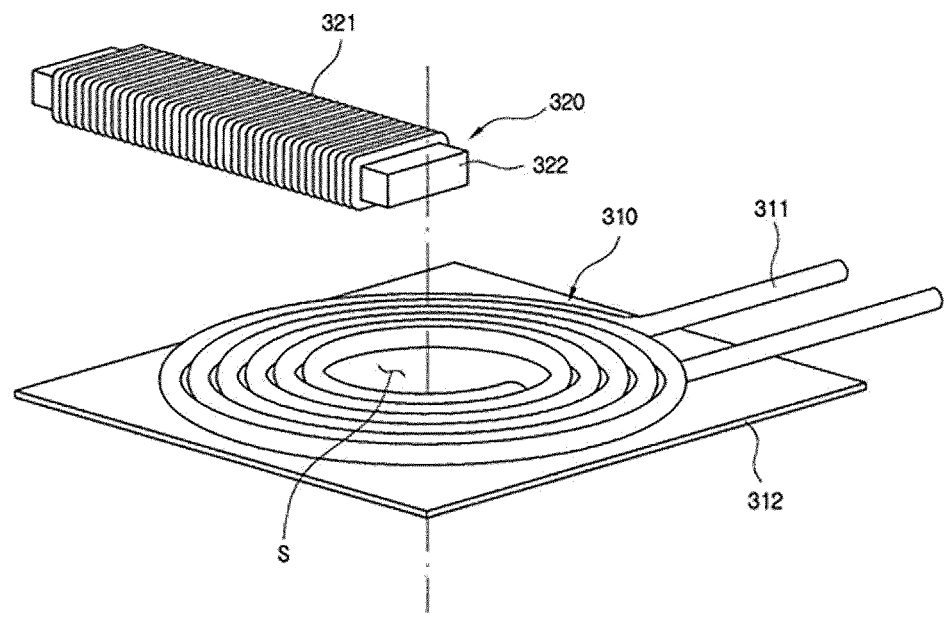
[FIG. 15]
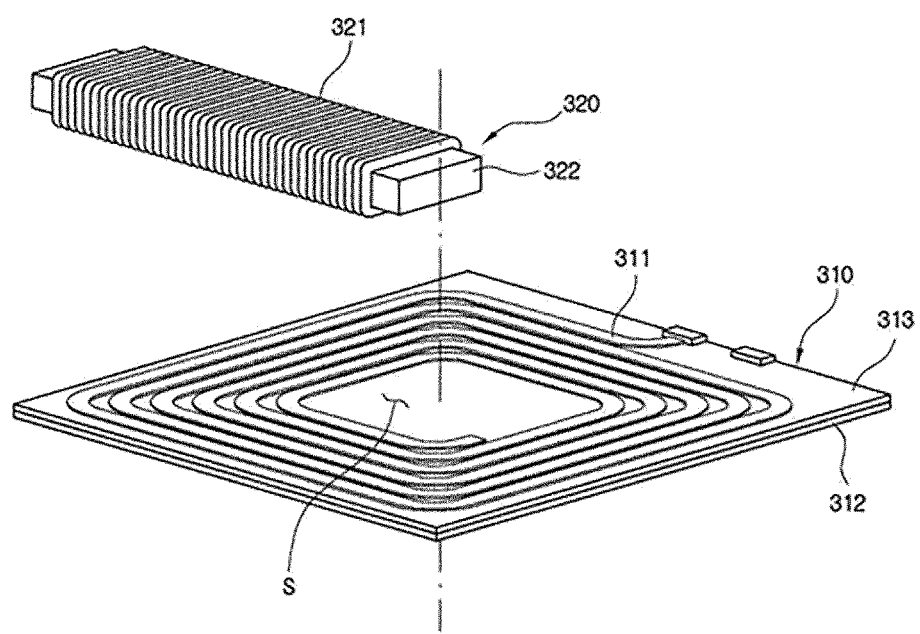

[FIG. 16]
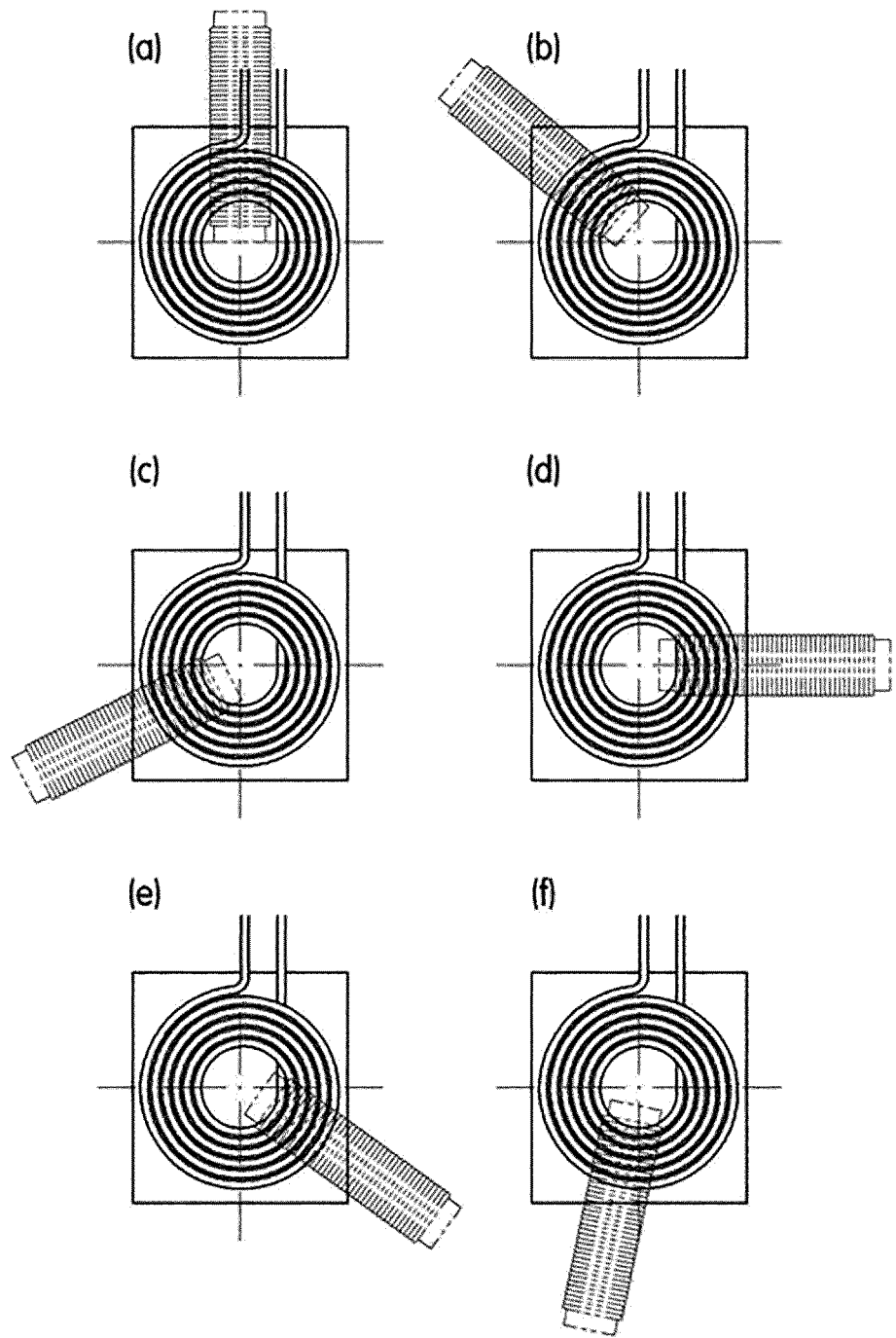

[FIG. 17]
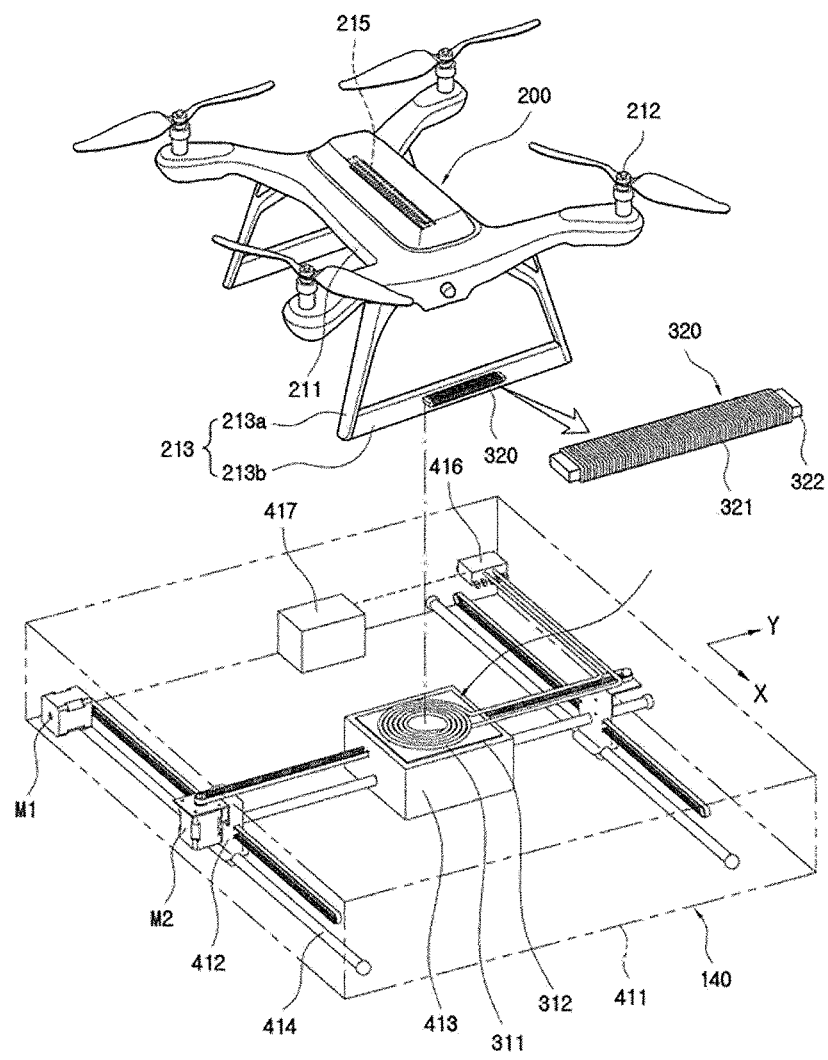

[FIG. 18]
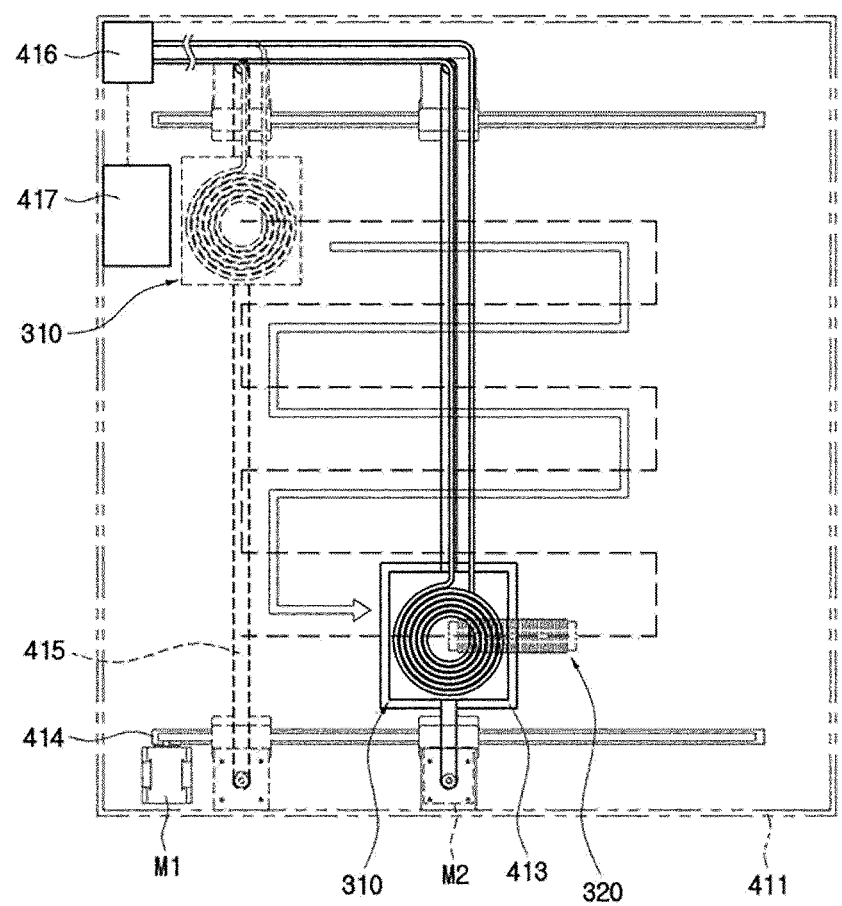

[FIG. 19]
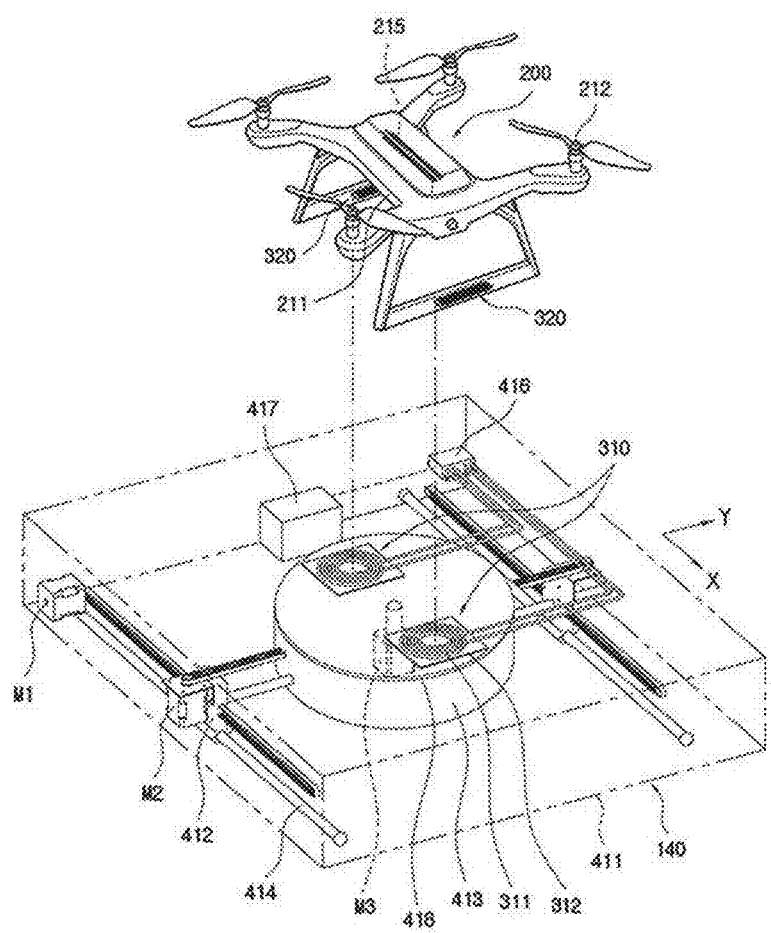

[FIG. 20]
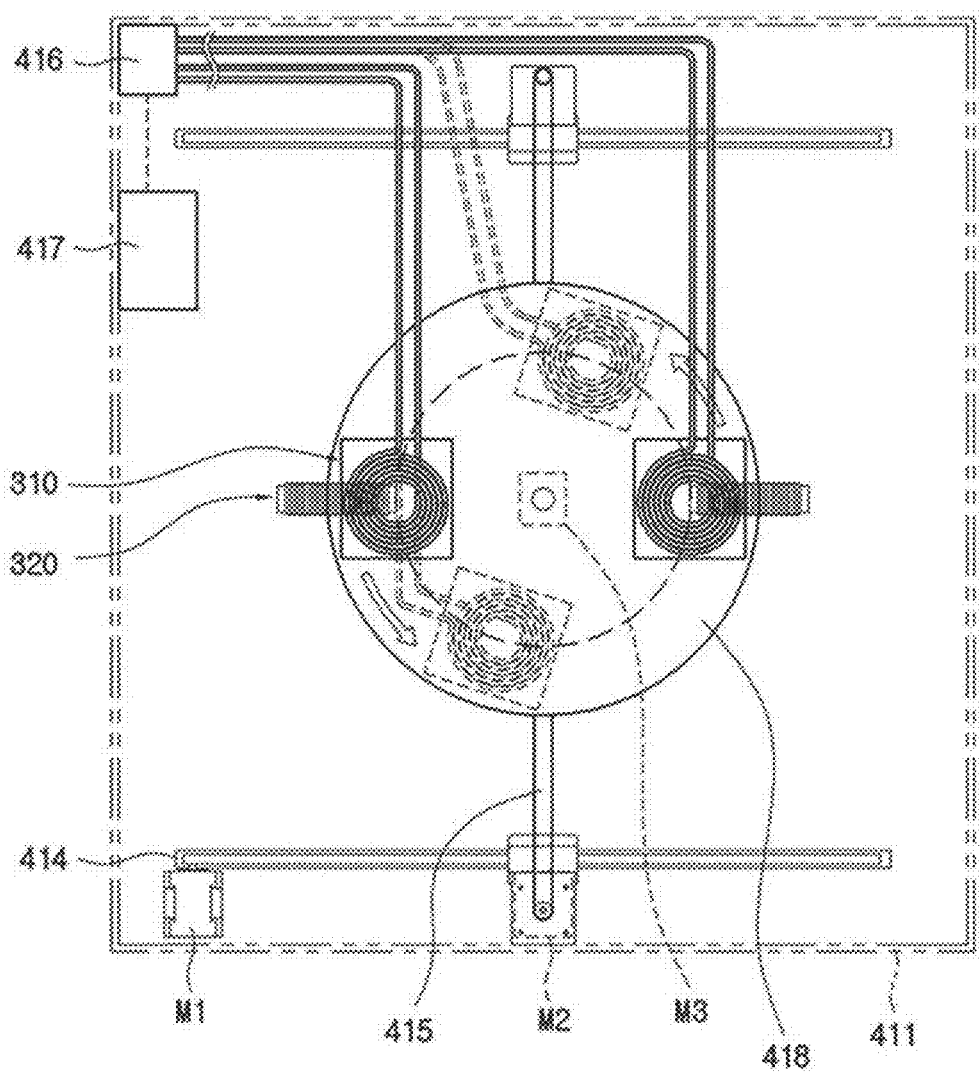

DRONE STATION

TECHNICAL FIELD

The present disclosure relates to a drone station, and more specifically, to a drone station which provides the taking-off and landing space of a drone to charge the drone.

BACKGROUND ART

With the development of a technology of a drone which is an unmanned aerial vehicle, the drone is used in various fields such as the security and the energy management using the drone. The drone is a kind of an aerial unit flying in the sky by rotating multiple propellers using the power of a battery. The drone is configured to fly in various patterns according to the operation of a remote controller of the user.

The drone requires the charging of the battery for the long-time flight due to a very high battery consumption. Therefore, a technology of installing a drone station to charge the battery of the drone, thereby enabling the long-time flight of the drone is being developed.

As an example, a drone station is installed on a smart street lamp, and the drone wirelessly charges a battery by moving to an adjacent drone station when an amount of the battery is reduced to a predetermined amount or less.

However, conventionally, since the drone is landed at the drone station using only the GPS information, there is a problem in that the center of resonance between the drone station and the drone is not accurately aligned, thereby reducing the charging efficiency, and increasing the charging time due to the reduction in the charging efficiency.

Further, conventionally, there is a problem in that the drone charged at the drone station is out of the charging position, or crashes at the drone station due to the external environmental factors such as the wind and the vibration.

DISCLOSURE

Technical Problem

The present disclosure is proposed to solve the above conventional problems, and an object of the present disclosure is to provide a drone station which allows the center of resonance of a drone to be always accurately aligned regardless of the initial landing position of the drone.

Further, another object of the present disclosure is to provide a drone station which may increase the degree of freedom of the charging between a wireless power transmission module and a wireless power reception module.

Technical Solution

To achieve the objects, a drone station according to an exemplary embodiment of the present disclosure includes: a landing guidance instrument and a wireless charging instrument formed on the landing guidance instrument, and for wirelessly transmitting a power to a drone positioned on a top, in which the landing guidance instrument is formed with an inclined surface moving a landed drone to the top of the wireless charging instrument.

The wireless charging instrument may be formed in a loop shape, and may include: a power transmission coil for wirelessly transmitting a power to the drone positioned on the top.

The drone station may further include: a guide member spaced apart from the power transmission coil, and for generating an electromagnetic force to fix the drone positioned on the top of the wireless charging instrument. At this time, the guide member is disposed on an outer circumference of the power transmission coil.

The landing guidance instrument is formed with an accommodation groove in which the wireless charging instrument is accommodated, and the inclined surface has a slope reduced from an outer circumference of the landing guidance instrument toward the accommodation groove.

The landing guidance instrument may further include: a vibration member for generating a vibration on a bottom of the inclined surface or a rolling member composed of a plurality of spheres disposed on the inclined surface.

The drone station may further include: a protective cover for covering the drone positioned on the wireless charging instrument, in which the protective cover may be changed to an opened state when the drone takes off and lands.

The protective cover includes: a rotary shaft, a first cover rotated by a rotation of the rotary shaft, and a second cover rotated by the rotation of the rotary shaft, and rotated in a direction opposite to the first cover.

The wireless charging instrument may include: a wireless power transmission module, and the wireless power transmission module may include: a wireless power transmission antenna for sending a power source in a wireless method, in which the wireless power transmission antenna may have a flat form around which a conductive member is wound in a loop shape.

The wireless charging instrument may further include: a control module and at least one operating member moved along a X-axis direction and a Y-axis direction perpendicular to each other through a control of the control module, and the wireless power transmission module may be fixed to one side of the operating member and a position of the wireless power transmission module may be changed by the movement of the operating member.

The wireless power transmission module may include: a shield sheet disposed on one surface of the wireless power transmission antenna, and the shield sheet may be a flat-shaped sheet including at least one of a ferrite, a polymer, and an amorphous ribbon.

The wireless power transmission antenna may be one of an antenna pattern patterned on one surface of a circuit board in a loop shape and a flat-shaped coil.

The drone may be embedded with a wireless power reception module for receiving the wireless power sent by the wireless power transmission module, and the wireless power reception module may include: a wireless power reception antenna composed of a coil wound in a longitudinal direction such that a conductive member surrounds a circumferential surface of a magnetic core having a predetermined length.

When the wireless power reception module and the wireless power transmission module are aligned, one end of the magnetic core may be disposed to be positioned in a hollow portion formed in a central region of the wireless power transmission antenna.

The wireless power reception module may be embedded in a landing gear contacting the wireless charging instrument when the drone is landed, and the wireless power transmission module may be moved such that the end of the magnetic core is positioned within a hollow portion formed in a central region of the wireless power reception antenna through the movement of an operating member included in the wireless charging instrument.

The wireless power reception module may be embedded in each of two landing gears disposed to be spaced apart from each other at an interval, the wireless charging instrument may further include: a rotary member rotatably coupled to the operating member, and one surface of the rotary member has two wireless power transmission modules disposed to be spaced apart from each other at a predetermined interval. At this time, the distance between the two wireless power transmission modules is formed to have a same size as a distance between two landing gears.

Advantageous Effects

According to the present disclosure, the drone station may be formed with the inclined surface, thereby always moving the drone to the charging region even if the drone is landed in the non-charging region.

Further, the drone station may be formed with the inclined surface and the guide member, thereby always moving the drone to the position having the optimal charging efficiency even if the drone is landed in the non-charging region or at the position having the low charging efficiency.

Further, the drone station may be formed with the auxiliary member for assisting the movement of the drone along the inclined surface, thereby always moving the drone to the position having the optimal charging efficiency even if the inclined surface is smoothly formed.

Further, the drone station may move the drone to the position having the optimal charging efficiency through the inclined surface and the guide member, thereby minimizing the charging time of the drone to maximize the operating time of the drone.

Further, the drone station may include the guide member, thereby minimizing the movement of the drone due to the external environments when the drone is charged to prevent the drone from being separated from the charging region, or crashing at the drone station.

Further, the drone station may have the wireless power transmission antenna and the wireless power reception antenna configured in the flat type and the solenoid type, respectively, to rule out the influence of the angle upon the alignment for the wireless charging, thereby increasing the degree of freedom of the charging.

DESCRIPTION OF DRAWINGS

FIG. 1 is a diagram for explaining a drone station according to an exemplary embodiment of the present disclosure.

FIG. 2 is a perspective diagram of the drone station according to the exemplary embodiment of the present disclosure.

FIG. 3 is a top diagram of the drone station according to the exemplary embodiment of the present disclosure.

FIG. 4 is a cross-sectional diagram of the cut-out surface of the drone station illustrated in FIG. 3 taken along the line A-A'.

FIGS. 5 and 6 are diagrams for explaining a landing guidance instrument illustrated in FIG. 2.

FIGS. 7 to 11 are diagrams for explaining a wireless charging instrument illustrated in FIG. 2.

FIGS. 12 and 13 are diagrams for explaining a modified example of the drone station according to the exemplary embodiment of the present disclosure.

FIGS. 14 to 20 are diagrams for explaining the wireless charging instrument illustrated in FIG. 2.

MODE FOR INVENTION

Hereinafter, the most preferred exemplary embodiments of the present disclosure will be described with reference to the accompanying drawings in order to specifically describe the exemplary embodiments such that those skilled in the art to which the present disclosure pertains may easily implement the technical spirit of the present disclosure. First, in adding reference numerals to the components of each drawing, it should be noted that the same components have the same reference numerals as much as possible even if they are illustrated in different drawings. Further, in describing the present disclosure, when it is determined that the detailed description of the related well-known configuration or function may obscure the gist of the present disclosure, the detailed description thereof will be omitted.

Referring to FIG. 1, a drone station 100 wirelessly transmits (sends) the power to a drone 200 landed on the top. That is, the drone station 100 is installed on a street lamp, a vehicle, or the like to sense the drone 200 landed on the top and then wirelessly transmit the power to the drone 200.

To this end, referring to FIGS. 2 to 4, the drone station 100 includes a landing guidance instrument 120 and a wireless charging instrument 140.

The landing guidance instrument 120 is a flat-shaped instrument configuring the drone station 100, and may be formed of the flat-shaped instrument having various shapes such as the circular shape and the rectangular shape.

The landing guidance instrument 120 is formed with an accommodation groove 122. A wireless charging instrument 140 is accommodated in the accommodation groove 122. The accommodation groove 122 is formed to have the shape corresponding to the shape of the wireless charging instrument 140. As an example, the accommodation groove 122 is formed to include the center point of the landing guidance instrument 120.

The landing guidance instrument 120 is formed with an inclined surface 124 for guiding the drone 200 to be landed at the position having the highest wireless charging efficiency. The inclined surface 124 has the slope reduced from the outer circumference of the landing guidance instrument 120 toward the accommodation groove 122. The inclined surface 124 has the slope of a set angle (O).

The drone 200 landed on the landing guidance instrument 120 moves to the top of the wireless charging instrument 140 positioned at the center of the landing guidance instrument 120 while sliding along the inclined surface 124. At this time, when the inclined surface 124 has the steep slope, the drone 200 moving along the inclined surface 124 may fall down, such that the inclined surface 124 is formed to have the slope of the set angle (O) within the range in which the drone 200 does not fall down.

As a result, the landing guidance instrument 120 moves the drone 200 landed on the top along the inclined surface 124 to guide the drone 200 to be positioned at the top of the wireless charging instrument 140.

The landing guidance instrument 120 may include an auxiliary member for assisting the movement of the drone 200 along the inclined surface 124. At this time, the inclined surface 124 may move the drone 200 to the wireless charging instrument 140 even when being formed to have a smoother slope than that of the landing guidance instrument 120 not including the auxiliary member.

Referring to FIG. 5, the landing guidance instrument 120 may include a vibration member 126 for generating the vibration. The vibration member 126 generates the vibration in the landing guidance instrument 120 to assist the movement of the drone 200. The vibration member 126 generates the vibration in the landing guidance instrument 120 such that the drone 200 landed on the top of the landing guidance instrument 120 smoothly moves along the inclined surface 124. The vibration member 126 is operated when the drone 200 is landed on the top of the landing guidance instrument 120. When the vibration member 126 is operated, the vibration is generated in the landing guidance instrument 120. The drone 200 slides and moves toward the wireless charging instrument 140 due to the vibration of the landing guidance instrument 120.

Referring to FIG. 6, the landing guidance instrument 120 may include a rolling member 128 for assisting the movement of the drone 200 along the inclined surface 124. As an example, the rolling member 128 includes a plurality of spheres disposed on the inclined surface 124 of the landing guidance instrument 120. The rolling member 128 is rotated when the drone 200 is landed on the top of the landing guidance instrument 120 to move the drone 200 toward the landing guidance instrument 120.

The landing guidance instrument 120 is applicable as long as it is the member capable of assisting the movement of the drone 200 along the inclined surface 124 other than the aforementioned vibration member 126 and rolling member 128.

The wireless charging instrument 140 is the flat-shaped instrument for wirelessly charging the drone 200, and may be formed of the flat-shaped instrument having various shapes such as the circular shape and the rectangular shape. The wireless charging instrument 140 is formed in the shape corresponding to the shape of the accommodation groove 122 formed in the landing guidance instrument 120.

Referring to FIG. 7, the wireless charging instrument 140 includes a power transmission coil 142 for wirelessly charging the drone 200.

The power transmission coil 142 is disposed on the upper surface of the wireless charging instrument 140. The power transmission coil 142 wirelessly transmits the power to a power reception coil 210 of the drone 200 through the wireless power transmission (WPT) of a magnetic resonance method. The power transmission coil 142 may be disposed on the bottom surface of the wireless charging instrument 140, or may also be disposed inside the wireless charging instrument 140.

The power transmission coil 142 is formed in the loop shape around which a winding shaft is wound many times. As an example, the power transmission coil 142 is formed in parallel with the drone station 100 by being wound around the winding shaft perpendicular to the drone station 100 many times.

The power transmission coil 142 may also be configured in the solenoid form in which a wire is wound around a magnetic body. However, the power transmission coil 142 is preferably formed in the loop shape having a pre-determined area in order to secure the wireless charging region. Here, although not illustrated in FIG. 7, both ends of the power transmission coil 142 are connected to a power supply source (not illustrated).

Referring to FIG. 8, the power reception coil 210 disposed on the drone 200 is preferably configured in the solenoid form in which the wire is wound around the magnetic body. That is, by configuring the power transmission coil 142 having the loop shape and the power reception coil 210 having the solenoid form, it is possible to maximize the charging efficiency of the drone 200.

Meanwhile, to enhance the charging efficiency of the drone 200, it is necessary to align the center of resonance between the power transmission coil 142 and the power reception coil 210 of the drone 200.

Referring to FIG. 9, the position of the coil having the maximum charging efficiency is changed according to the eccentric distance of the power transmission coil 142. That is, as the eccentric distance of the power transmission coil 142 is increased, the position of the coil having the maximum charging efficiency is changed from an internal coil to an external coil.

Further, there exists the possibility in which the drone 200 is out of the charging position, or crashes at the drone station 100 due to the external environmental factors such as the wind and the vibration upon the wireless charging.

Therefore, referring to FIGS. 10 and 11, the wireless charging instrument 140 may further include a guide member 144 for aligning the power transmission coil 142 and the power reception coil 210 of the drone 200 and preventing them from being separated.

The guide member 144 is disposed on the outer circumference of the power transmission coil 142. The guide member 144 is disposed to be spaced apart from the power transmission coil 142. As an example, the guide member 144 is an electromagnet for generating an electromagnetic force to fix the drone 200.

Here, FIG. 11 illustrates that the guide member 144 having the circular shape is disposed on the upper surface of the wireless charging instrument 140, but the present disclosure is not limited thereto, and the guide member 144 may be formed in various shapes such as the square and the parallel line.

Further, the guide member 144 may also generate the electromagnetic force only at a specific position for landing and fixing the drone 200 at the position having the optimal charging efficiency to fix the drone 200.

As a result, the wireless charging instrument 140 may land the drone 200 at the position having the optimal wireless charging efficiency, and prevent the charging drone 200 from being separated from the charging position due to the external environmental factors.

Referring to FIGS. 12 and 13, the drone station 100 may further include a protective cover 160 for protecting the landed drone 200. Here, FIG. 12 illustrates that the protective cover 160 covers only the wireless charging instrument 140, but the protective cover 160 may also cover the entire drone station 100.

The protective cover 160 is formed in the hemispheric shape. The protective cover 160 normally maintains the closed state, and is changed to the opened state when the drone 200 takes off and is landed. The protective cover 160 normally maintains the closed state, and is changed to the opened state if the drone 200 is close to the drone station 100 for the landing, or the drone 200 takes off from the drone station 100.

Here, it has been illustrated that the protective cover 160 is formed in the hemispheric shape in order to easily explain the protective cover 160, but the shape of the protective cover 160 is not limited to the hemispheric shape, and applicable as long as it is the shape capable of protecting the drone 200 landed on the drone station 100.

As an example, the protective cover 160 may be configured to include a rotary shaft 162 driven by a motor, and a first cover 164 and a second cover 166 rotated by the rotation of the rotary shaft 162. The first cover 164 and the second cover 166 are rotated in different directions when the rotary shaft 162 is rotated by driving the motor. As the first cover 164 and the second cover 166 are rotated in different directions, the protective cover 160 is opened and closed.

The drone station 100 may further include a control circuit (not illustrated) for controlling the operation of the protective cover 160. The control circuit determines the taking-off and landing of the drone 200 through the communication with the drone 200 or a drone control device, and opens the protective cover 160 when it is determined that the drone 200 takes off or is landed.

Referring to FIGS. 14 and 15, the wireless charging instrument 140 of the drone station 100 includes a wireless power transmission module 310. At this time, the drone 200 includes a wireless power reception module 320 corresponding to the wireless power transmission module 310. Here, the wireless power transmission module 310 corresponds to the aforementioned power transmission coil 142 of the wireless charging instrument, and the wireless power reception module 320 corresponds to the power reception coil 210 disposed on the drone 200.

The wireless power transmission module 310 generates the magnetic field using the power source supplied by the power supply source and sends the power together with the magnetic field in the wireless method, and the wireless power reception module 320 receives the power sent from the wireless power transmission module 310 to generate an induced electromotive force to produce the power.

Here, the power supply source may also be a commercial power source supplied by a power source line, and may also be a known battery.

At this time, the wireless power transmission module 310 and the wireless power reception module 320 may have different forms of a wireless power transmission antenna 311 and a wireless power reception antenna 321 for transmitting or receiving the wireless power.

Specifically, the wireless power transmission module 310 may be configured in the flat shape in which the wireless power transmission antenna 311 for sending the wireless power is wound in the loop shape, and may have the form in which a shield sheet 312 is disposed on one surface of the wireless power transmission antenna 311.

Further, the wireless power reception module 320 may have the solenoid form including a magnetic core 322 of a BAR shape having a predetermined length, and a coil around which a conductive member is wound in the longitudinal direction to surround the circumferential surface of the magnetic core 322, in which the coil may serve as the wireless power reception antenna 321.

Here, the wireless power transmission antenna 311 may also be a flat-shaped coil around which the conductive member is wound many times (see FIG. 14), and may also be an antenna pattern on which the conductive member such as the copper foil is patterned on at least one surface of a circuit board 313 (see FIG. 15).

Further, it has been illustrated in the drawings that one wireless power transmission antenna 311 is configured, but the present disclosure is not limited thereto, and it should be noted that a plurality of wireless power transmission antennas 311 may also be configured.

Further, the number of turns of the coil wound around the magnetic core 322 may be appropriately changed according to the target transmission power, and the materials of the magnetic core 322 and the shield sheet 312 may be appropriately changed according to the frequency used.

Meanwhile, the magnetic core 322 and/or the shield sheet 312 may use the material having the high permeability, the low permeability loss rate, and the high Q value, and use the material having the high saturation magnetic flux density. As a specific example, the magnetic core 322 and/or the shield sheet 312 may be formed of the magnetic body including at least fifteen kinds among an Ni—Zn ferrite, an Mn—Zn ferrite, a polymer, and an amorphous ribbon.

Further, the shield sheet 312 may also be flaked to improve the flexibility or suppress the generation of the eddy current and separately formed into a plurality of fine pieces. Further, the magnetic core 322 and/or the shield sheet 312 may also be in the form of being laminated in multiple layers. However, the material of the magnetic body is not limited thereto, and it should be noted that all known magnetic bodies which may be used in the wireless power transmission technology may be appropriately used.

As described above, in the drone station 100, one end of the magnetic core 322 is disposed to be positioned in a hollow portion(S) of the wireless power transmission antenna 311 if the wireless power transmission module 310 and the wireless power reception module 320 are aligned with each other for the wireless power transmission, and more preferably, one end of the magnetic core 322 may be aligned to be positioned on a center portion (O) of the hollow portion of the wireless power transmission antenna 311.

As a result, the magnetic field emitted from the wireless power transmission module 310 implemented in the flat form may be smoothly induced to the wireless power reception module 320 implemented in the solenoid form.

That is, if the wireless power antenna is configured in the flat form, the path of the main magnetic field may be formed in the hollow portion of the antenna, and if the wireless power antenna is configured in the solenoid form, the path of the main magnetic field may be formed on the end of the magnetic core 322.

Therefore, if one end of the magnetic core 322 is disposed to be positioned in the hollow portion (S) of the wireless power transmission antenna 311, the direction of the main magnetic field emitted from the wireless power transmission module 310 implemented in the flat form may coincide with the direction of the main magnetic field of the wireless power reception module 320 implemented in the solenoid form, such that the main magnetic field is smoothly induced to the wireless power reception antenna 321.

Further, if the wireless power transmission antenna 311 included in the wireless power transmission module 310 is configured in the flat form having the loop shape and the wireless power reception module 320 is configured in the solenoid form, the optimal wireless charging efficiency may be obtained when the end of the magnetic core 322 is positioned within the hollow portion (S) of the wireless power transmission antenna 311 even if the magnetic core 322 is disposed in the state of being tilted at any angle with respect to the X-axis or the Y-axis.

That is, as illustrated in FIG. 16, when the end of the magnetic core 322 is positioned within the hollow portion (S) of the wireless power transmission antenna 311 without having to consider the angle formed between the longitudinal direction of the magnetic core 322 included in the wireless power reception module 320 and the radius direction or the width direction of the wireless power transmission antenna 311, the end of the magnetic core 322 may be aligned in the state capable of obtaining the optimal wireless charging efficiency, thereby increasing the degree of freedom of the charging for implementing the optimal charging efficiency.

Further, the drone station 100 may implement the wireless power transmission through the wireless power transmission antenna 311 included in the wireless power transmission module 310 over the large area, thereby implementing the large capacity transmission of the kW level, and the wireless power transmission antenna 311 with the wider area may be formed, thereby enhancing the heat-dissipation performance to enhance the charging efficiency or shorten the charging time.

Meanwhile, the aforementioned drone station 100 may configure a charging system for charging a battery (not illustrated) embedded in the drone 200.

Referring to FIGS. 17 and 19, the wireless power reception module 320 for receiving the wireless power may be embedded in the drone 200, and the wireless power transmission module 310 for sending the wireless power may be embedded in the drone station 100, respectively.

According to the present exemplary embodiment, the wireless power transmission module 310 generates the magnetic field using the power source supplied by a power supply source 417 and sends the power together with the magnetic field in the wireless method, and the wireless power reception module 320 receives the power sent by the wireless power transmission module 310 to generate the induced electromotive force to produce the power for charging the battery embedded in the drone 200.

Here, the detailed description of the wireless power transmission module 310 and the wireless power reception module 320 will be omitted because the contents thereof are the same as the contents described with reference to FIGS. 14 and 15.

Further, the power supply source 417 may also be the commercial power source supplied by the power source line, and may also be a separate battery embedded in the drone station 100 itself, and the power source supplied from the power supply source 417 may be supplied or blocked toward the wireless power transmission module 310 by a control module 416 embedded in the drone station 100.

According to the exemplary embodiment of the present disclosure, the drone 200 may be the drone of the helicopter or quadcopter method which may vertically move upward and vertically move downward.

That is, the drone 200 may include a body part 211, a power generator 212, and a landing gear 213.

The body part 211 may be mounted with various electronic units according to the use purpose, and embedded with a battery 215 for driving various electronic units. The shape of the body part 211 may use various known shapes.

The power generator 212 may be connected to the body part 211 to generate the power for the flight of the body part 211. As an example, the power generator 212 may have the form in which a propeller is rotated by driving a motor. One power generator 212 may also be provided, but a plurality of power generators 212 may be provided to enable the free change of direction, and the overall driving of the power generator 212 may be controlled by a controller (not illustrated) embedded in the body part 211.

Therefore, when the motor is driven by the controller, the propeller is rotated to generate the lift or the thrust, such that the drone 200 may be levitated, and if the plurality of power generators 212 are provided, the flight direction may be changed according to the output difference between the respective power generators 212.

Here, the controller embedded in the body part 211 may control the overall operation and driving of the drone 200, and may be the form of a chipset mounted on a circuit board (not illustrated). As an example, the controller may be a microprocessor.

The landing gear 213 is a structure for supporting the weight of the body part 211 if the drone 200 takes off and is landed or moors at the drone station 100. The landing gear 213 may have the form including a plurality of leg parts 213*a* extending from the body part 211 and a connection part 213*b* connecting the lower ends of the leg parts. One landing gear 213 may also be provided and a plurality of landing gears 213 may be disposed to be spaced apart from each other at an interval.

Further, the drone 200 may include at least one camera unit 214 for photographing the ground or the surrounding images. Further, the drone 200 may include various sensors (not illustrated) for collecting or sensing various information for the state of the drone 200 and the surrounding environments. As an example, as the sensors, various known sensors, such as the gyro sensor, the geomagnetic sensor, the gravity sensor, the altitude sensor, the slope sensor, the humidity sensor, the wind sensor, the air flow sensor, the temperature sensor, the acoustic sensor, and the illuminance sensor, may be appropriately installed. The camera unit 214 and the sensors may be controlled by the controller.

Further, the controller may further include a communication module for transmitting the image photographed by the camera unit or transmitting and receiving data such as the flight information of the drone 200 or a control instruction transmitted from the outside, and may be additionally mounted with various electronic equipment applied to the known drone.

However, the drone 200 applicable to the exemplary embodiment of the present disclosure is not limited to the aforementioned structure, and may also be additionally mounted with various units applicable to the known drone 200 according to the use purpose of the drone 200. Further, the drone 200 may be used for various purposes for leisure, surveillance, industry, information collection, and the like, and may also have the form in which at least one wing for generating the lift is fixed and coupled to a streamlined fuselage.

At this time, the wireless power reception module 320 may be embedded in the landing gear 213 of the drone 200, and the wireless power reception module 320 may be electrically connected to the battery 215 through the controller included in the body part 211.

Here, one wireless power reception module 320 or a plurality of wireless power reception modules 320 may be embedded in the landing gear 213. Further, when embedded in the landing gear 213, the plurality of wireless power reception modules 320 may also be embedded in the same landing gear, but the same number of wireless power reception modules 320 may be embedded in each of both sides with respect to the center of gravity of the drone 200 to increase the weight balance of the drone 200. As an example, as illustrated in FIG. 19, if the drone 200 includes two landing gears 213 disposed to be spaced apart from each other at an interval, the wireless power reception module 320 may be embedded in each of two landing gears 213. Further, if the plurality of wireless power reception modules 320 are embedded in the landing gear 213, a plurality of wireless power transmission modules 310 embedded in a station 100 may also be provided, and the wireless power transmission module 310 may also be provided to have a one-to-one correspondence with wireless power reception modules 320.

Further, as described above, the wireless power reception module 320 may have the solenoid form including the coil around which the conductive member is wound in the longitudinal direction of the magnetic core having a predetermined length.

Further, the wireless power reception module 320 may be embedded in the connection part 213*b* of the landing gear 213 such that one surface of the magnetic core becomes the state of being parallel with one surface of the drone station 100 in the state where the drone 200 is landed on one surface of the drone station 100, and the wireless power reception module 320 may be embedded in the drone station 100 to be disposed on the planar surface parallel with one surface of the drone station 100.

Therefore, if the wireless power reception module 320 and the wireless power transmission module 310 are aligned with each other in the state of being landed on one surface of the drone state 100 or the stand-by state, the drone 200 receives the wireless power sent by the drone station 100 through the wireless power reception module 320, such that the battery 215 embedded in the body part 211 may be charged to drive the drone 200.

At this time, the wireless power transmission module 310 may be embedded in the drone station 100 to be movable in the X-axis and Y-axis directions perpendicular to each other.

Therefore, if the drone 200 is landed on one surface of the drone station 100 through the landing gear 213, the wireless power transmission module 310 may be aligned such that the end of the magnetic core is positioned in the hollow portion (S) of the wireless power transmission antenna configured in the flat form through the position movement.

Therefore, the positions of the wireless power transmission module 310 and the wireless power reception module 320 are aligned, such that the battery 215 embedded in the drone 200 may be charged with the optimal charging efficiency.

Further, since the wireless power transmission antenna included in the wireless power transmission module 310 is embedded in the drone station 100 to be configured in the flat form having the loop shape and disposed on the planar surface parallel with one surface of the drone station 100 and the wireless power reception module 320 is embedded in the landing gear 213 to be configured in the solenoid form and become the state of being parallel with one surface of the drone station 100, the wireless power transmission antenna of the wireless power transmission module 310 may maintain the state of being always parallel with one surface of the magnetic core included in the wireless power reception module 320 if the drone 200 is landed on the drone station 100, and the end of the magnetic core may be easily positioned within the hollow portion (S) of the wireless power transmission antenna through the position movement of the wireless power transmission module 310 even if the magnetic core is disposed in the state of being tilted at any angle with respect to the X-axis or the Y-axis.

That is, when the end of the magnetic core is positioned within the hollow portion (S) of the wireless power transmission antenna without having to consider the angle formed between the longitudinal direction of the magnetic core included in the wireless power reception module 320 and the radius direction or the width direction of the wireless power transmission antenna even if the landing gear 213 in which the wireless power reception module 320 is embedded is disposed at any position of one surface of the drone station 100, the end of the magnetic core may be aligned in the state capable of obtaining the optimal wireless charging efficiency. As a result, the drone station 100 according to the exemplary embodiment of the present disclosure may increase the degree of freedom of the charging.

Further, the wireless power transmission through the wireless power transmission antenna included in the wireless power transmission module 310 may be performed over the large area, thereby implementing the large capacity transmission of the kW level, and the wireless power transmission antenna may be formed on the wider area, thereby enhancing the heat-dissipation performance to enhance the charging efficiency or shorten the charging time.

Further, the wireless power transmission module 310 embedded in the landing gear 213 may be configured in the solenoid form to be easily embedded compared to the flat form even if the size of the landing gear 213 is not changed. Therefore, the size of the landing gear 213 may be prevented from being increased in the process of applying the wireless power transmission module 310, thereby preventing the increase in the air resistance due to the increase in the size.

To this end, as illustrated in FIGS. 17 to 20, the drone station 100 may include a housing 411, an operating member embedded in the housing 411 to be movable along the X-axis and the Y-axis, and a control module 416 for driving the operating member, and the wireless power transmission module 310 may be fixed to the operating member. As a result, the position of the wireless power transmission module 310 may be changed together with the operating member when the operating member is moved by the control module 416. Here, the housing 411 may be formed to have the horizontal surface whose at least one surface has a predetermined area such that the drone 200 may be landed, and may also have the form of being embedded in the ground and also have the form of being fixed to other structures such that the horizontal surface is exposed to the outside.

Meanwhile, the operating member may be one of a first slider 412 reciprocally moved along the X-axis and a second slider 413 reciprocally moved along the Y-axis direction, one of the first slider 412 and the second slider 413 may be coupled to be reciprocally movable in the direction perpendicular to the movement direction of the other one, and the first slider 412 and the second slider 413 may be reciprocally moved by driving motors M1, M2 controlled by the control module 416. Here, as a method for delivering the driving forces generated by the motors M1, M2 to the first slider 412 and the second slider 413, all of various known methods such as the pulley method, the screw method, and the gear method may be used.

As a specific example, the first slider 412 may be disposed to be reciprocally movable along a first guide 414 disposed in the direction parallel with the X-axis with respect to the bottom surface of the housing 411 by driving a first motor M1, the second slider 413 may be disposed to be reciprocally movable along a second guide 415 disposed in the direction parallel with the Y-axis by driving a second motor M2 with respect to the first slider 412, and the wireless power transmission module 310 may be fixed to and installed on the upper surface of the second slider 413.

Here, the overall operation of the first motor M1 and the second motor M2 may be controlled by the control module 416, and the wireless power transmission module 310 may also be electrically connected to the control module 416 and the overall driving thereof may be controlled. Further, the control module 416 may include a general circuit element for driving the wireless power transmission module 310 or the like.

Therefore, if the drone 200 is landed on the drone station 100, the positions of the first slider 412 and the second slider 413 may be changed by the control of the control module 416 and the end of the magnetic core of the wireless power reception module 320 embedded in the landing gear 213 may be disposed to be positioned within the hollow portion (S) of the wireless power transmission antenna, thereby implementing the optimal charging efficiency.

As an example, as illustrated in FIG. 19, the second slider 413 may alternately move the X-axis direction and the Y-axis direction by a predetermined distance by driving the control module 416 inside the housing 411, thereby changing the position of the wireless power transmission module 310 to the position of being aligned with the wireless power reception module 320. However, the movement path of the second slider 413 is not limited thereto, and it should be noted that the second slider 413 may be moved along various paths.

At this time, the second slider 413 or the wireless power transmission module 310 may include a sensing part (not illustrated) for sensing the alignment state with the magnetic core, and the sensing part may be controlled by the control module 416. Therefore, the control module 416 may adjust the position of the second slider 413 based on the information sensed by the sensing part, thereby aligning the wireless power transmission module 310 and the wireless power reception module 320.

As an example, the sensing part may also be an infrared sensor for confirming the position of the end of the magnetic core through the infrared rays and may also be a magnetic field sensor for sensing the magnitude of the magnetic field induced in the wireless power reception antenna. However, the sensing part is not limited thereto, and it should be noted that various known sensors are applicable as long as they are capable of confirming the mutual positions between the second slider 413 and the end of the magnetic core. Further, it has been described that the position of the wireless power transmission module 310 is changed by two sliders 412, 413 by the control of the control module 416 but the present disclosure is not limited thereto and it should be noted that all known methods capable of changing the position in the directions of two axes perpendicular to each other are applicable.

As another example, as in the aforementioned exemplary embodiment, the station 100 may include the housing 411, the operating member embedded in the housing 411 to be movable along the X-axis and the Y-axis, and the control module 416 for driving the operating member, and include a rotary member 418 rotatably coupled to the operating member. Here, the wireless power reception module 320 may have the form of being embedded in each of two landing gears 213 disposed to be spaced apart from each other at an interval in the drone 200.

At this time, two wireless power transmission modules 310 may be fixed to the rotary member 418, and two wireless power transmission modules 310 may be fixed to the upper surface of the rotary member 418 in the state of being spaced apart from each other by the distance between two landing gears 213 in which each of two wireless power reception modules 320 is embedded. As a result, the position of the wireless power transmission module 310 fixed to the rotary member 418 may be changed along the X-axis and Y-axis directions through the movement of the operating member when the operating member is moved by the control module 416, and the wireless power transmission module 310 is rotated around the Z-axis by rotating the rotary member 418, thereby changing the angle.

As an example, the operating member may be one of the first slider 412 reciprocally moved along the X-axis and the second slider 413 reciprocally moved along the Y-axis direction, one of the first slider 412 and the second slider 413 may be coupled to be slidable in the direction perpendicular to the movement direction of the other one, and the rotary member 418 may be coupled to be rotatable around the Z-axis with respect to one of the first slider 412 and the second slider 413.

Further, the first slider 412, the second slider 413, and the rotary member 418 may be reciprocally moved or rotated by driving the motors M1, M2, M3 controlled by the control module 416. Here, as the method for delivering the driving forces generated by the motors M1, M2 to the first slider 412 and the second slider 413, all of various known methods such as the pulley method, the screw method, and the gear method may be used.

As a specific example, the first slider 412 may be disposed to be reciprocally movable along the first guide 414 disposed in the direction parallel to the X-axis with respect to the bottom surface of the housing 411 by driving the first motor M1, and the second slider 413 may be disposed to be reciprocally movable along the second guide 415 disposed in the direction parallel to the Y-axis by driving the second motor M2 with respect to the first slider 412. Further, the rotary member 418 may be rotated around the Z-axis by driving a third motor M3 with respect to the second slider 413, and the wireless power transmission module 310 may be fixed to and installed on the upper surface of the rotary member 418.

Here, the overall operation of the first motor M1, the second motor M2, and the third motor M3 may be controlled by the control module 416, and the wireless power transmission module 310 may also be electrically connected to the control module 416 and the overall driving thereof may be controlled. Further, the control module 416 may include a general circuit element for driving the wireless power transmission module 310 or the like.

Therefore, if the drone 200 is landed on the station 100, the positions of the first slider 412 and the second slider 413 are changed by the control of the control module 416 and then the end of the magnetic core of the wireless power reception module 320 embedded in each of two landing gears 213 may be disposed to be positioned within the hollow portion (S) of two wireless power transmission antennas by rotating the rotary member 418, thereby implementing the optimal charging efficiency.

Further, the wireless power transmission may be simultaneously implemented in the state where two wireless power transmission modules 310 and two wireless power reception modules 320 are aligned with each other, thereby shortening the charging time of the battery 215 embedded in the drone 200.

Meanwhile, although not illustrated in the drawings, if the plurality of wireless power transmission modules 310 are provided, one of the plurality of wireless power transmission modules 310 may be fixed to be positioned on the rotational center axis of the rotary member 418. As a result, when the position of one of the wireless power transmission module 310 fixed to the rotational center axis of the rotary member 418 and the wireless power reception module 320 embedded in the landing gear 213 is first aligned by the position movement of the first slider 412 and the second slider 413 in the method described in the aforementioned exemplary embodiment and then the rotary member 418 is rotated, the other wireless power transmission module 310 fixed to the position out of the rotational center axis of the rotary member 418 and the other wireless power reception module 320 embedded in the landing gear 213 may be easily aligned.

Meanwhile, it should be noted that the aforementioned drone station 100 is applicable to various electronic products other than the drone. As an example, the drone station 100 is also applicable to the appliances including the TV, the robot cleaner, and the like, the notebook PC, the electric vehicle, and the like.

Further, unlike the aforementioned description, it should be noted that the drone station 100 according to the exemplary embodiment of the present disclosure has the wireless power transmission module 310 configured in the solenoid form, and the wireless power reception module 320 embedded in the drone 200 may be formed in the flat form.

Further, although not illustrated in the drawings, it is noted that all of the wireless power transmission module 310 and the wireless power reception module 320 embedded in the drone station 100 and the drone 200 may also be configured in the flat form or configured in the solenoid form.

Although the preferred exemplary embodiments of the present disclosure have been described above, it is understood that the present disclosure may be modified in various forms, and those skilled in the art may practice various modified examples and changed examples without departing from the scope of the claims of the present disclosure.

The invention claimed is:

1. A drone station comprising:
a wireless charging instrument formed on a landing guidance instrument, and for wirelessly transmitting a power to a drone positioned thereon;
the landing guidance instrument having an inclined surface moving a landed drone to the top of the wireless charging instrument,
wherein the wireless charging instrument includes:
a wireless power transmission module configured to be movable and formed in a loop shape;
a control module;
at least one operating member moved along X-axis or Y-axis directions perpendicular to each other through a control of the control module; and
a rotary member rotatably coupled to the at least one operating member, and
wherein the wireless power transmission module is fixed to the rotary member, and
wherein a position of the wireless power transmission module is changed by the movement of the at least one operating member and rotated around a direction perpendicular to a movement direction of the at least one operating member.

2. The drone station of claim 1,
wherein the wireless charging instrument comprises: a power transmission coil for wirelessly transmitting a power to the drone positioned on the top.

3. The drone station of claim 2, further comprising: a guide member spaced apart from the power transmission coil, and for generating an electromagnetic force to fix the drone positioned on the top of the wireless charging instrument.

4. The drone station of claim 3,
wherein the guide member is disposed on an outer circumference of the power transmission coil.

5. The drone station of claim 1,
wherein the landing guidance instrument is formed with an accommodation groove in which the wireless charging instrument is accommodated.

6. The drone station of claim 1,
wherein the landing guidance instrument further comprises: a vibration member for generating a vibration on a bottom of the inclined surface.

7. The drone station of claim 1,
wherein the landing guidance instrument further comprises: a rolling member composed of a plurality of spheres disposed on the inclined surface.

8. The drone station of claim 1, further comprising: a protective cover for covering the drone positioned on the wireless charging instrument,
wherein the protective cover is changed to an opened state when the drone takes off and lands.

9. The drone station of claim 8,
wherein the protective cover comprises:
a rotary shaft;
a first cover rotated by a rotation of the rotary shaft; and
a second cover rotated by the rotation of the rotary shaft, and rotated in a direction opposite to the first cover.

10. The drone station of claim 1,
wherein the wireless power transmission module comprises: a wireless power transmission antenna for sending a power source in a wireless method, the wireless power transmission antenna being in a flat form around which a conductive member is wound in a loop shape.

11. The drone station of claim 10,
wherein the wireless power transmission module comprises: a shield sheet disposed on one surface of the wireless power transmission antenna.

12. The drone station of claim 11,
wherein the shield sheet is a flat-shaped sheet including at least one of a ferrite, a polymer, and an amorphous ribbon.

13. The drone station of claim 10,
wherein the wireless power transmission antenna is one of an antenna pattern patterned on one surface of a circuit board in a loop shape and a flat-shaped coil.

14. The drone station of claim 10,
wherein when a wireless power reception module of the drone and the wireless power transmission module are aligned, one end of a magnetic core is disposed to be positioned in a hollow portion formed in a central region of the wireless power transmission antenna.

15. The drone station of claim 1,
wherein one surface of the rotary member has two wireless power transmission modules disposed to be spaced apart from each other at a predetermined interval.

* * * * *